(12) United States Patent
Kim et al.

(10) Patent No.: US 8,921,501 B2
(45) Date of Patent: Dec. 30, 2014

(54) ULTRAVIOLET CURABLE RESIN COMPOSITION FOR TRANSPARENT COLOR-PAINTED STEEL SHEET, AND STEEL SHEET USING SAME

(75) Inventors: Jin Tae Kim, Gwangyan-si (KR); Sang Gon Kim, Pyeongtaek-si (KR); Jae Ryung Lee, Goyang-si (KR); Jung Su Kim, Gwangyang-si (KR); Moon Jae Kwon, Daegu (KR); Chang Se Byeon, Gwangyang-si (KR)

(73) Assignees: Noroo Holdings Co., Ltd., Anyang-si (KR); Posco, Pohang-si (KR)

( * ) Notice: Subject to any disclaimer, the term of this patent is extended or adjusted under 35 U.S.C. 154(b) by 677 days.

(21) Appl. No.: 13/139,333

(22) PCT Filed: Nov. 12, 2009

(86) PCT No.: PCT/KR2009/006645
§ 371 (c)(1),
(2), (4) Date: Jun. 13, 2011

(87) PCT Pub. No.: WO2010/074405
PCT Pub. Date: Jul. 1, 2010

(65) Prior Publication Data
US 2011/0250415 A1 Oct. 13, 2011

(30) Foreign Application Priority Data
Dec. 23, 2008 (KR) .......................... 10-2008-0132579

(51) Int. Cl.
| | |
|---|---|
| C08F 224/00 | (2006.01) |
| C07D 303/40 | (2006.01) |
| B32B 27/38 | (2006.01) |
| B32B 5/16 | (2006.01) |
| C08F 283/00 | (2006.01) |
| C08L 63/10 | (2006.01) |
| C09D 151/08 | (2006.01) |
| C09D 163/10 | (2006.01) |
| C09D 175/16 | (2006.01) |
| G03F 7/027 | (2006.01) |

(52) U.S. Cl.
CPC ............. *C08F 283/008* (2013.01); *C08L 63/10* (2013.01); *C09D 151/08* (2013.01); *C09D 163/10* (2013.01); *C09D 175/16* (2013.01); *G03F 7/027* (2013.01)
USPC ........... 526/273; 522/170; 428/216; 428/418; 428/331

(58) Field of Classification Search
None
See application file for complete search history.

(56) References Cited

U.S. PATENT DOCUMENTS

| | | |
|---|---|---|
| 5,128,387 A | 7/1992 | Shustack |
| 7,976,902 B2 | 7/2011 | Han et al. |
| 2004/0091632 A1 | 5/2004 | Matsunami et al. |
| 2008/0199723 A1 | 8/2008 | Cho et al. |

FOREIGN PATENT DOCUMENTS

| | | | |
|---|---|---|---|
| CN | 1532049 A | 9/2004 | |
| CN | 101307194 A | 11/2008 | |
| JP | 5017740 A | 1/1993 | |
| JP | 11269406 A | 10/1999 | |
| JP | 2003313489 A | 11/2003 | |
| KR | 20040030554 A | 4/2004 | |
| KR | 10-2006-0072475 | * 6/2006 | ........... C09D 163/00 |
| KR | 20060072475 A | 6/2006 | |
| KR | 20060076953 A1 | 7/2006 | |
| KR | 100624097 B1 | 9/2006 | |
| KR | 100725249 B1 | 5/2007 | |
| WO | 2004011246 A1 | 2/2004 | |
| WO | 2007013761 A1 | 2/2007 | |
| WO | 2008016220 A1 | 2/2008 | |

\* cited by examiner

*Primary Examiner* — David Sample
*Assistant Examiner* — Nicole T Gugliotta
(74) *Attorney, Agent, or Firm* — The Webb Law Firm

(57) ABSTRACT

An ultraviolet (UV) curable resin composition is provided which includes 25 to 45 parts by weight of a modified epoxy acrylate oligomer; and 10 to 25 parts by weight of a urethane acrylate oligomer. Further provided is a metal sheet that is transparent and corrosion resistant, impact resistant, scratch resistant, adhesive, anti-corrosive, and bendable (workable) by forming a coating film on the surface of a metal material such as a steel material, specifically a steel sheet, using the UV curable resin composition mentioned above.

14 Claims, No Drawings

ULTRAVIOLET CURABLE RESIN COMPOSITION FOR TRANSPARENT COLOR-PAINTED STEEL SHEET, AND STEEL SHEET USING SAME

TECHNICAL FIELD

The present invention relates to an ultraviolet (UV) curable resin composition and a steel sheet using the same, and more particularly, to a UV curable resin composition, characterized by its transparency, adhesion, anti-corrosivity and bendability, which is formed as a coating film on a surface of a steel sheet to improve productivity and does not use a solvent, thereby providing an environmentally friendly steel sheet.

BACKGROUND ART

Generally, a coating film is formed on the surface of a steel material such as a steel sheet to protect the surface thereof, prevent corrosion, and provide a sense of appeal to the material.

As a representative method of forming a coating film on a steel material such as a steel sheet, there is a pre-coated metal (PCM) method for directly coating a surface of a steel material with a resin composition such as paint, and a laminating method for adhering a film sheet on which a coating film is previously formed to a steel material.

However, in the conventional methods described above, since the resin composition for forming a coating film, coating paint, is prepared as a polyester or polyurethane type, which is coated on a steel material such as a steel sheet by a thermocuring method, high temperature drying equipment for evaporating a solvent during coating is needed.

Therefore, the resin composition described above requires more time for painting, resulting in a decrease in productivity.

Particularly, all conventional methods for forming a coating film on a surface of a metal material such as a steel product, for example, solvent evaporation-type painting, thermocurable painting, electrostatic and electrodeposition painting, and powder painting, need a heating process, and therefore production time and energy consumption is increased.

Furthermore, since conventional oil-type resin compositions, that is, paint, include materials causing air pollution and global warming, there is a need to develop more environmentally friendly methods.

For this reason, a method using a UV curable resin composition enabling environmental friendliness and mass production has been developed to resolve the above-mentioned problems. In Korea, a UV curable paint for paper was developed in the early 1980s, and various paint for wood and plastic are being developed and used. However, due to limitations of the UV curable paint, for example, failure in an adhesive strength and processibility caused by fast curing and radical polymerization, UV curable paints for metals have only developed occasionally and have limits in technical development.

Particularly, the UV curable painting method mentioned above is not suitable for coating a metal material such as a steel product because of high curing density and low adhesion.

As an example of such a UV curable resin composition, Korean Patent Publication No. 2006-0072475 discloses a UV curable paint composition for metal including 20 to 50 wt % of an epoxy acrylate oligomer, 10 to 40 wt % of a urethane acrylate oligomer, 20 to 40 wt % of a reactive acryl monomer, 5 to 10 wt % of a photoinitiator, and 1 to 5 wt % of an additive. In Korean Patent No. 0725249, as a UV curable paint for metal having excellent adhesion and anti-corrosion with respect to a metal material, a paint including 25 to 40 wt % of an epoxy or urethane acrylate oligomer, 15 to 25 wt % of a reactive acryl monomer, 20 to 30 wt % of a pigment, 5 to 10 wt % of a photoinitiator, 0.5 to 5 wt % of an adhesion promoter, and 3 to 5 wt % of an additive is disclosed.

However, since the above-mentioned conventional technique uses an inorganic anti-corrosive pigment to enhance corrosion resistance, the method cannot provide transparency to a steel product, and therefore the steel product has poor anti-corrosivity for preventing corrosion as well as poor bendability.

SUMMARY OF THE INVENTION

The present invention is directed to a UV curable resin composition for forming a coating film for metal, specifically, a steel material, which provides transparency, corrosion resistance, impact resistance, scratch resistance, adhesion, anti-corrosivity and bendability (processibility).

The present invention is also directed to a steel sheet which has a color-painted chrome-free coating film as an under coat formed on the top surface of the metal material, specifically a steel material such as a steel sheet, and a coating film of UV curable resin composition as the top coat formed on a top surface of the color-painted chrome-free coating film.

One aspect of the present invention provides a UV curable resin composition including 25 to 45 parts by weight of a modified epoxy acrylate oligomer, and 10 to 25 parts by weight of a urethane acrylate oligomer.

Another aspect of the present invention provides a steel sheet on which a coating film is formed by coating the UV curable resin composition according to the present invention.

Still another aspect of the present invention provides a steel sheet which has a color-painted chrome-free coating film as an under coat formed on the top surface of the steel sheet, and a coating film formed using a UV curable resin composition as the top coat on a top surface of the color-painted chrome-free coating film.

When a UV curable resin composition according to the present invention is formed as a coating film on a surface of metal such as a steel sheet, the steel sheet can have transparency, corrosion resistance, impact resistance, scratch resistance, adhesion, anti-corrosivity, and bendability (processibility).

In addition, by using a UV curable resin composition, instead of an oil-type resin composition dried by heat, the process can be environmentally friendly because it uses no solvent and has improved producibility.

DETAILED DESCRIPTION OF THE INVENTION

Hereinafter, exemplary embodiments of the present invention will be described in detail. However, the present invention is not limited to the exemplary embodiments disclosed below, but can be implemented in various instances. Therefore, the present exemplary embodiments are provided for complete disclosure of the present invention and to fully inform the scope of the present invention to those ordinarily skilled in the art.

The present invention provides a UV curable resin composition including 25 to 45 parts by weight of a modified epoxy acrylate oligomer, and 10 to 25 parts by weight of a urethane acrylate oligomer.

In another aspect, the present invention provides a steel sheet on which a coating film is formed by coating the UV curable resin composition onto the sheet.

When a coating film is formed by coating the UV curable resin composition according to the present invention on a steel material such as a steel sheet for a home appliance, for example, an air conditioner or a washing machine, the steel material can have transparency, corrosion resistance, impact resistance, scratch resistance, adhesion, anti-corrosivity, and bendability (processibility).

Particularly, a urethane acrylate-type composition used for common UV curable resin compositions may satisfy most physical properties needed for the UV curable resin composition according to the present invention, but may not satisfy corrosion resistance. Even when surface treating agents are coated as an under coat of a steel sheet, the urethane acrylate-type composition cannot sufficiently satisfy physical properties required for the steel sheet, and a bifunctional urethane acrylate, which is the most flexible, still may not satisfy processibility.

In addition, among a polyester acrylate-type composition, an aromatic-type composition may have satisfactory corrosion resistance and scratch resistance among the physical properties required for a coating film of a steel sheet, but may also have poor weather resistance and adhesion, particularly, between coating films; and an aliphatic-type composition may have satisfactory weather resistance but poor processibility and adhesion.

Specifically, a bifunctional polyester acrylate-type composition has good processibility and adhesion but has poor corrosion resistance and scratch resistance, while a hexafunctional polyester acrylate-type composition has excellent corrosion resistance and scratch resistance but has poor processibiltiy and adhesion.

Meanwhile, an epoxy acrylate-type composition is generally includes bisphenol A as its source material. When the bisphenol A-type epoxy acrylate is used by itself, it has high crosslinking density as a coating film, is hard, and has good chemical resistance, which is a main characteristic of an epoxy. Therefore, the bisphenol A-type epoxy acrylate may have satisfactory corrosion resistance and scratch resistance among the above-mentioned physical properties, but yellowing may occur during a transparent coating process.

As modified epoxy acrylate oligomer products have recently been developed to alleviate the poor weather resistance of the epoxy acrylate, such oligomer products may be difficult to apply to steel sheets for construction materials 100% exposed to an exterior environment. However, when the oligomer products are applied to steel sheets for construction materials and home appliances that are not exposed to exterior environments, there is little concern for weather resistance.

To satisfy the above-mentioned physical properties, a UV curable resin composition according to the present invention is formed by mixing an acrylate oligomer, particularly, a modified epoxy acrylate oligomer, having excellent processibility and adhesion, with an acryl monomer, preferably, a monofunctional and/or bifunctional reactive acryl monomer to partially compensate for weather resistance and processibility.

The UV curable resin composition according to the present invention may specifically include 25 to 45 parts by weight of a modified epoxy acrylate oligomer and 10 to 25 parts by weight of a urethane acrylate oligomer.

In a specific aspect, the UV curable resin composition according to the present invention may further include 21 to 80 parts by weight of a reactive acryl monomer, 1 to 20 parts by weight of a photoinitiator, and 0.1 to 10 parts by weight of an additive, and preferably 32 to 48 parts by weight of a reactive acryl monomer, 5 to 10 parts by weight of a photoinitiator, and 1.3 to 2.7 parts by weight of an additive.

Here, the reactive acryl monomer may particularly include 25 to 35 parts by weight of a monofunctional reactive acryl monomer and 7 to 13 parts by weight of a bifunctional reactive acryl monomer, and the additive may include 0.4 to 0.6 parts by weight of an antifoaming agent, 0.4 to 0.6 parts by weight of a labeling agent, and 0.5 to 1.5 parts by weight of an adhesion promoter.

When the UV curable resin composition is formed as a coating film, the modified epoxy acrylate oligomer provides bendability (processibility) and adhesion, particularly, adhesion between coating films. Since there are no limits to any conventional modified epoxy acrylate oligomers used in the art for such a purpose, specifically, a urethane-modified epoxy acrylate oligomer may be used, and more specifically, at least one mixture selected from Miramer ME1201 produced by Miwon Commercial Co., Ltd., CN 150/80 produced by Satomer, EA 1580 produced by HS Chemtron Co., Ltd., and 3020-A80 produced by AGI Corporation may be used.

Here, when the modified epoxy acrylate oligomer, specifically, the urethane-modified epoxy acrylate oligomer is used in an amount less than 25 parts by weight, the corrosion resistance and scratch resistance may be degraded. When the modified epoxy acrylate oligomer is used in an amount more than 45 parts by weight, viscosity of the paint may increase, and thus workability may be degraded. Therefore, the content of the modified epoxy acrylate oligomer may be 25 to 45 parts by weight, and preferably, 30 to 38 parts by weight, on the basis of the total weight of the UV curable resin composition.

When the UV curable resin composition is formed as a coating film, the urethane acrylate oligomer, according to the present invention, and the modified epoxy acrylate oligomer provide bendability (processibility) and adhesion, specifically, adhesion between coating films. Since there are no limits to any conventional urethane acrylate oligomers used in the art for such a purpose, specifically, a bifunctional urethane acrylate oligomer, and more specifically, at least one mixture selected from UA-2205, UA-2890BX and UA-5221 produced by HS Chemtron Co., Ltd., CN 966J75 and CN 966H90 produced by Sartomer, and Ebecryl 244 and Ebecryl 284 produced by Cytec Industries may be used.

Here, when the urethane acrylate oligomer is used in an amount less than 10 parts by weight, the hardness of the coating film may increase, and thus bendability (processibility), particularly, bending processibility and adhesion, may be degraded; and when the urethane acrylate oligomer is used in an amount more than 25 parts by weight, the hardness of the coating film may decrease, and scratch resistance may be degraded. Therefore, the content of the urethane acrylate oligomer may be 10 to 25 parts by weight, preferably, 15 to 20 parts by weight, on the basis of the total weight of the UV curable resin composition.

Specifically, the bifunctional urethane acrylate may be a reaction product of alicyclic diisocyanate and (meth)acrylate having a hydroxy group.

Here, the alicyclic diisocyante may be, but is not limited to, an isoporondiisocyanate or dicyclohexanediisocyante.

Particularly, the bifunctional urethane acrylate according to the present invention has two functional groups, and thus reduces crosslinking bonds during the UV polymerization, thereby maintaining flexibility. Any conventional bifunctional urethane acrylates for such a purpose may be used without specific limits.

In a specific aspect, the bifunctional urethane acrylate according to the present invention may be alicyclic diisocyanate prepolyer-containing bifunctional urethane acrylate, which may be synthesized by addition-reaction of alicyclic diisocyanate, for example, isophoronediisocyanate (IPDI), dicyclohexanediisocyanate (Desmodur W), etc. with hydroxyl acrylic aicd ester having a hydroxy group.

Here, the urethane acrylate having the above-mentioned structure is prepared and provided in various forms by various acrylate oligomer manufacturers.

When the UV curable resin composition is formed as a coating film, a reactive acryl monomer, according to the present invention, provides weather resistance and bendability (processability). Any conventional reactive acryl monomers used in the art for such a purpose may be used without specific limits, but it is preferable that a mixture of a monofunctional acryl monomer and a bifunctional acryl monomer be used.

Here, the reactive acryl monomer may be used in an amount of 21 to 80 parts by weight, and particularly, 32 to 48 parts by weight. When the reactive acryl monomer is used in an amount less than 21 parts by weight, the viscosity may increase and thus the adhesion may be degraded, and when the reactive acryl monomer is used in an amount more than 80 parts by weight, UV curability may decrease and thus productivity may be degraded.

Specifically, the reactive acryl monomer according to the present invention may include 20 to 50 parts by weight of a monofunctional reactive acryl monomer and 1 to 30 parts by weight of a bifunctional reactive acryl monomer, and more particularly, 25 to 35 parts by weight of a monofunctional acryl monomer and 7 to 13 parts by weight of a bifunctional acryl monomer.

Here, the monofunctional reactive acryl monomer may be at least one selected from the group consisting of acrylic morpholine (ACMO), tetrahydroperfuryl acrylate (THFA), hydroxy ethyl acrylate (HEA), hydroxy propyl acrylate (HPA) and isobonyl acrylate (IBOA).

Here, when the monofunctional reactive acryl monomer is used in an amount less than 20 parts by weight, the viscosity may increase and thus the adhesion may be degraded, and when the monofunctional reactive acryl monomer is used in an amount more than 50 parts by weight, the UV curability may decrease and thus the productivity may be degraded.

The bifunctional acryl monomer is mainly used as a viscosity controlling agent. Any conventional bifunctional reactive acryl monomers used in the art for such a purpose may be used without specific limits, but a more preferable bifunctional acryl monomer may include at least one monomer selected from the group consisting of diethylene glycol diacrylate (DEGDA), dipropylene glycol diacrylate (DPGDA), tripropylene glycol diacrylate (TPGDA), hexanediol diacrylate (HDDA), polyethylene glycol 400 diacrylate (PEG 400 DA), and polyethylene glycol 600 diacrylate (PEG 600 DA).

Here, when the bifunctional reactive acryl monomer is used in an amount less than 1 part by weight, the viscosity may increase, and when the bifunctional reactive acryl monomer is used in an amount more than 30 parts by weight, the overall physical properties of the coating film may be degraded.

The photoinitiator according to the present invention polymerizes the UV resin composition by irradiating UV rays after the coating film is formed by coating the UV resin composition on a surface of a metal such as a steel sheet. Any polymerization initiators used for such a purpose may be used, and the polymerization initiator is preferably a conventional UV-sensitive polymerization initiator, and more preferably a benzophenone-, benzoin-, benzoinether-, benzylketal-, acetophenone-, anthraquinone- or thioxanthone-based compound. Here, these compounds may be used independently or in combination of at least two thereof.

As the photoinitiator, at least one of Irgacure 184, 754 and 819, Darocur 1173 and TPO produced by Ciba Geigy, Micure CP-4, MP-8, BP and TPO produced by Miwon Corporation may be used. However, it is preferable that liquid-phase initiators, for example, Irgacure 754, Darocur 1173 and Micure MP-8, be used in order to realize all characteristics of the UV curable composition as a solventless-type UV coating agent and to facilitate an easy preparation.

In the present invention, any conventional additives used in the art can be used without specific limits. However, it is preferable that an antifoaming agent for removing air bubbles generated during roll coating, a labeling agent affecting an exterior of a coating film and a surface scratching effect and/or an adhesion promoter for increasing adhesion be used.

Here, the additive may be included in an amount of 0.1 to 10 parts by weight, and particularly 1.3 to 2.7 parts by weight, on the basis of the total weight of the UV curable resin composition. On the basis of the total weight of the additive, 20 to 30 parts by weight of an antifoaming agent, 20 to 30 parts by weight of a labeling agent, and 40 to 60 parts by weight of an adhesion promoter may be used.

Particularly, the additive may include 0.05 to 5 parts by weight of an antifoaming agent, 0.05 to 5 parts by weight of a labeling agent and 0.1 to 10 parts by weight of an adhesion promoter, on the basis of the total weight of the UV curable resin composition.

Here, on the basis of the total weight of the UV curable resin composition, when the content of the adhesion promoter is less than 0.1 parts by weight, the interlayer adhesion may significantly decrease, and when the content of the adhesion promoter is more than 10 parts by weight, the viscosity of paint may increase, thereby affecting workability.

In addition, as a representative product capable of being used as the antifoaming agent, one of TEGO Airex 920 and 932, and BYK 088 and 1790 may be selected, but the present invention is not limited thereto.

Furthermore, as a representative product capable of being used as the labeling agent, one of TEGO Glide 410 and 440, TEGO Rad 2250, and BYK-UV 3500 and 3510 may be selected, but the present invention is not limited thereto.

Furthermore, as the adhesion promoter, an acryl phosphate-based adhesion promoter, for example, hydroxy ethyl acryloyl phosphate or hydroxy ethyl methacrylate phosphate may be used, but the present invention is not limited thereto.

Meanwhile, the UV curable resin composition according to the present invention may further include a variety of additives, for example, an antioxidant, a photostabilizer, a UV absorbing agent, a thermal polymerization inhibitor, a lubricating agent, an antifoaming agent, a dispersing agent, an antistatic agent, a plasticizer, an organic filler, or a mixture thereof when necessary. Here, the content of the additive may vary according to the user's discretion without changing the physical properties required for the UV curable resin composition of the present invention, for example, 0.1 to 15 parts by weight, on the basis of the total weight of the UV curable resin composition.

As a representative example capable of being used for the antioxidant, Irganox 1010, Irganox 1035, Irganox 1076 or Irganox 1222 (Ciba Geigy Limited., Japan), as the photo stabilizer, Tinuvin 292, Tinuvin 144 and Tinuvin 622LD (Ciba Geigy Limited., Japan), sanol LS-770, sanol LS-765, sanol LS-292, or sanol LS-744 (Sankyo, Japan), as the UV absorbing agent, Tinuvin P, Tinuvin 234, Tinuvin 320, Tinuvin 328 (Ciba Geigy Limited., Japan), Sumisorb 110, Sumisorb 130, Sumisorb 140, Sumisorb 220, Sumisorb 250, Sumisorb 320, or Sumisorb 400 (Sumimoto, Japan); for the thermal polymerization initiator, HQ, THQ or HQMME; and for the lubricating agent, antifoaming agent and dispersing agent, products manufactured by conventional paint additive manufacturers, for example BYK may be used; but the present invention is not limited thereto.

In addition, as the antistatic agent, a polyoxyethylenealkylether-based chemical; a polyoxyethyeleamine-based chemical; a non-ionic-based chemical, for example, a glycerin or sorbitol fatty acid ester-based chemical; anionic-based chemical, for example, alkylsulfonate, alkylbenzenesulfonate, alkylsulfate or alkyl phosphate; quaternary ammonium salt or a mixture thereof may be used.

The present invention relates to a steel sheet formed by coating a UV curable resin composition according to the present invention on a surface of a metal substrate such as a steel sheet, irradiating UV rays thereto, and curing the coated composition to form a coating film.

Here, the steel sheet is selected from the group consisting of a cold-rolled steel sheet; a zinc-plated steel sheet; a zinc-based electroplated steel sheet; a galvanized steel sheet; an aluminum-plated steel sheet; a plated steel sheet containing impurities or a heterogeneous metal such as cobalt, molybdenum, tungsten, nickel, titanium, aluminum, manganese, iron, magnesium, tin, copper or a mixture thereof on a plating layer; an aluminum alloy sheet containing silicon, copper, magnesium, iron, manganese, titanium, zinc or a mixture thereof; a zinc-plated steel sheet on which a phosphate salt is coated; and a hot-rolled steel sheet, and preferably a zinc-plated steel sheet.

However, a coating film is formed by painting the UV curable resin composition according to the present invention on the surface of a metal material, specifically, a steel material, for example, a steel sheet. The painting method for forming the coating film may include conventional painting methods used in the art, for example, dip coating, spray coating, roll coating and bar coating. A thickness of the painted coating film may be 0.5 to 10 μm.

In addition, a UV ray for curing the UV curable resin composition according to the present invention may have a wavelength of at least 400 nm or less.

In a specific aspect, as a light source for irradiating the UV ray, a metal halide lamp, a medium pressure mercury lamp, a high pressure mercury lamp, electrodeless H bulb, D bulb and V bulb (Fusion, U.S.A) may be selected, according to the use thereof and curing conditions.

A radiation dose of the UV ray may generally be in a range of 0.1 to 10 J/cm$^2$, and may be suitably controlled according to a composition of the UV curable resin composition and the user's discretion.

The present invention relates to a steel sheet created by forming a coating film on a surface of the steel sheet, and forming a different coating film formed by coating a UV curable resin composition on the surface of the previously formed coating film.

Particularly, the present invention also relates to a steel sheet created by forming a coating film as an under coat of the steel sheet and forming a different coating film formed by coating a UV curable resin composition on the surface of the coating film.

The present invention also relates to a steel sheet created by forming a coating film as an under coat of a steel sheet and forming a coating film by coating a UV curable resin composition on the previously formed coating film as a top coat.

In the present invention, a steel sheet having under and top coats may be prepared by coating a surface finishing agent on the top surface of the steel sheet, thereby forming a coating film, and then coating a UV curable resin composition on the surface of the coating film comprising the surface treating agent. Preferably, a transparent or color-painted chrome-free coating film is formed on the top surface of the steel sheet as an under coat, and a different coating film is formed by coating the UV curable resin composition according to the present invention on the top surface of the transparent or color-painted chrome-free coating film as a top coat.

The transparent or color-painted chrome-free coating film may have a thickness of 0.5 to 2 μm, and the coating film formed by coating the UV curable resin composition may have a thickness of 0.5 to 10 μm.

Here, when the transparent or color-painted chrome-free coating film is a coating film formed of a transparent or color-painted chrome-free coating film composition which is conventionally used in the art for surface treatment of a steel sheet, there are no specific limits thereto, but the coating film may be formed of a composition for treating the surface of a metal, the composition including, a) 100 parts by weight of a water-soluble organic resin-inorganic binder complex resin;

b) 1 to 10 parts by weight of an anti-corrosive and corrosion resistant agent; and c) 1 to 10 parts by weight of a metal chelating agent, on the basis of the total solid content.

Here, the water-soluble organic resin-inorganic binder complex resin used herein is prepared by reaction of an organic resin, an inorganic resin and a coupling agent.

In addition, the organic resin may be selected from the group consisting of a water-soluble epoxy resin having a carboxyl or hydroxyl group, an epoxy-phosphate resin, an epoxy-phosphate resin modified by an acryl-based or vinyl-based monomer, a vinyl-based resin, a water-dispersed urethane resin, and an acryl-urethane resin modified by an acryl-based or vinyl-based monomer.

Here, the epoxy resin may be a bisphenol A-type resin, a bisphenol F-type resin, or a novolac resin. The epoxy resin may have a molecular weight of 900 to 7000. When the molecular weight of the epoxy resin is less than 900, the modification is difficult, and a dry coating film shows poor water resistance. When the molecular weight of the epoxy resin is more than 7000, hydrolyzation by modification is difficult. In addition, an equivalent amount of epoxy in the epoxy resin may be 450 to 3500. To control the molecular weight and equivalent weight of the epoxy resin, a method for controlling the molecular weight by an addition reaction of bisphenol with a low-molecular-weight liquid epoxy resin may be used.

The epoxy resin may be widely used for coating metal because it shows good adhesion, thermal resistance, corrosion resistance, and top coat paintability. However, as a coating material, a thin film of only the epoxy resin may lack a coating film forming ability and corrosion resistance. Accordingly, in the epoxy resin, when a compound of a phosphonic acid of Formula 1 and a compound of a phosphinic acid of Formula 2 and/or an acryl monomer is modified, the epoxy resin may show a good ability of forming a coating film, good cohesion to a metal material, and more improved corrosion resistance. Such an organic resin may be an epoxy-phosphate resin prepared by the reaction of an epoxy resin with at least one selected from the group consisting of a compound of the phosphonic acid of Formula 1 and a compound of the phosphinic acid of Formula 2.

$(R)_{m1}[PO(OH)_2]_{n1}$            [Formula 1]

$(R)_{m2}(R')_q[PO(OH)_2]_{n1}$            [Formula 2]

In Formula 1 and 2, R and R' are independently hydrogen, or aliphatic or aromatic hydrocarbons having 1 to 20 carbon atoms, which may or may not be substituted with a hetero atom. m1 and m2 are independently any integers from 0 to 2, n1 and n2 are any integers from 1 to 3, and q is any integer of 0 to 2.

The compound of the phosphonic acid of Formula 1 and the compound of the phosphinic acid of Formula 2 may be used to increase curing speed when hydrolyzation of the modification resin and a curing agent formed with an amino resin are used. Therefore, they are very effective in improving workability.

The compound of the phosphonic acid of Formula 1 and the compound of the phosphinic acid of Formula 2 may be aminotrimethylphosphonic acid, amino-2-benzylphosphonic acid, 3-aminopropylphosphonic acid, o-aminophenylphosphonic acid, 4-methoxyphenylphosphonic acid, aminophenylphosphonic acid, aminopropylphosphonic acid, benzylphosphonic acid, butylphosphonic acid, 2-carboxylethylphosphonic acid, dodecylphosphonic acid, ethylphosphonic acid, hydrogen phosphonic acid, methylbenzylphosphonic acid, methylphosphonic acid, octadecylphosphonic acid, phenylphosphonic acid or diphenylphosphonic acid. In addition, the compounds of the molecules of Formula 1 and 2 preferably have a vinyl or acryl group, which is, for example, a condensation product of an acrylic monomer having a hydroxyl group and a compound selected from the group consisting of the compounds of the molecules of Formula 1 and 2, that is, vinyl phosphonic acid, 2-ethylmethacrylate phosphonic acid, or 2-ethylacrylate phosphonic acid.

When the number of moles of the compound selected from the group consisting of the compounds of the molecules of Formula 1 and 2 is less than 1%, on the basis of an equivalent amount of the epoxy resin, physical properties such as adhesion, corrosion resistance and hydrolyzation may be degraded, which is not preferable. When the number of moles of the compound selected from the group consisting of the compounds of the molecules of Formula 1 and 2 is more than 100%, on the basis of an equivalent amount of the epoxy resin, water resistance may be degraded due to the presence of an unreacted acid, which is not preferable either. Therefore, the number of moles of the compound selected from the group consisting of compounds of molecules of Formula 1 and 2 may be 5 to 80% on the basis of the equivalent amount of the epoxy resin.

In addition, the present invention may use a tertiary amine and an inorganic compound as reaction catalysts to catalyze reaction of the epoxy resin with the compounds of the phosphonic acid of Formula 1 and the phosphinic acid of Formula 2. The amount of the reaction catalyst may be used in an amount of 0 to 1 parts by weight on the basis of 100 parts by weight of a reaction product of the epoxy resin and the phosphonic/phosphinic acid compounds.

The reaction catalyst may be benzyldimethyl amine, tributyl amine, N,N-dimethyl aniline, trimethyl phosphine, lithium stearate, stannous octoate, zirconium octoate, triethylbenzylammonium chloride, or benzyltrimethylammonium hydroxide.

In addition, the epoxy-phosphate resin may be used by being modified by an acryl-based or vinyl-based monomer. The modification may be performed by a method of grafting an acryl-based or vinyl-based monomer to an epoxy-phosphate resin or a polymerization method using an unsaturated acid such as a maleic acid or fumaric acid.

The inorganic binder may be at least one selected from the group consisting of silica sol, alumina sol, titania sol and zirconia sol. In addition, the inorganic binder may have a particle size of 5 to 30 nm. Here, when the particle size of the inorganic binder is less than 5 nm, the product generally has high alkalinity, and thus water resistance and corrosion resistance are degraded. When the particle size of the inorganic binder is more than 30 nm, a pore is formed as the particle becomes larger causing a very low amount of a chrome-free treating agent to adhere thereto, and thus corrosion resistance is degraded.

Meanwhile, the corrosion-resistant and anti-corrosive additive included in a composition for treating the surface of a metal constituting a color-painted chrome-free coating film according to the present invention may be selected from the group consisting of an aluminum phosphate aqueous solution, a manganese phosphate aqueous solution, a zinc phosphate aqueous solution, molybdenum phosphate aqueous solution, and a fluorine phosphate soda aqueous solution, which include phosphoric acid as a stabilizer when the composition for surface treating of a metal is an acid solution. When the composition for surface treating of a metal is a base solution, the corrosion-resistant and anti-corrosion additive included in the composition for treating the surface of a metal constituting a color-painted chrome-free coating film, according to the present invention, may be selected from a hexaammonium hepta molybdate solution, a diammonium dihydrophosphate solution, an ammonium vanadate solution, a sodium vanadate solution, an ammonium zirconium carbonate solution, and an ammonium fluorozirconate solution, which include an amine as a stabilizer.

A metal chelating agent included in the composition for treating the surface of a metal constituting a color-painted chrome-free coating film, according to the present invention, may be at least one selected from the group consisting of organic titanate, organic zirconate and organic silane.

Hereinafter, the present invention will be described in further detail with respect to the following examples. The following examples are provided to merely describe the present invention in detail, not to limit the scope of the present invention.

EXAMPLES

Example 1

A paint composition was prepared by mixing 35 g of a modified epoxy acrylate oligomer [CN 150/80, Sartomer, U.S.A.], 15 g of a urethane acrylate oligomer [UA-5221, HS Chemtron, Korea], 30 g of tetrahydroperfuryl acrylate (THFA) [SR285, Sartomer, U.S.A.], 10 g of hexanediol diacrylate (HDDA) [Miramer M200, Miwon Corporation, Korea], 8 g of a photoinitiator [Darocur 1173, Ciba Chemicals, Switzerland], 0.5 g of an antifoaming agent [TEGO Airex 920, Evonik, Germany], 0.5 g of a labeling agent [TEGO Rad 2250, Evonik, Germany], and 1 g of an adhesion promoter. The composition of the components used is summarized in Table 1.

Example 2

A paint composition was prepared by mixing 34 g of a modified epoxy acrylate oligomer [CN 150/80], 16 g of a urethane acrylate oligomer [CN 966J75, Sartomer, U.S.A.], 30 g of isobonyl acrylate (IBOA) [SR506, Sartomer, U.S.A.], 10 g of tripropylene glycol diacrylate (TPGDA) [Miramer M220, Miwon Corporation, Korea], 8 g of a photoinitiator

[Darocur 1173, Ciba Chemicals, Switzerland], 0.5 g of an antifoaming agent [TEGO Airex 920, Evonik, Germany], 0.5 g of a labeling agent [TEGO Rad 2250, Evonik, Germany] and 1 g of an adhesion promoter. The composition of the components used is summarized in Table 1.

Example 3

A paint composition was prepared by mixing 35 g of a modified epoxy acrylate oligomer [3020-A80, AGI, Taiwan], 15 g of a urethane acrylate oligomer [UA-5221, HS Chemtron, Korea], 30 g of tetrahydroperfuryl acrylate (THFA) [SR285, Sartomer, U.S.A.], 10 g of hexanediol diacrylate (HDDA) [Miramer M220, Miwon Corporation, Korea], 8 g of a photoinitiator [Darocur 1173, Ciba Chemicals, Switzerland], 0.5 g of an antifoaming agent[TEGO Airex 920, Evonik, Germany], 0.5 g of a labeling agent [TEGO Glide 440, Evonik, Germany] and 1 g of an adhesion promoter. The composition of the components used is summarized in table 1.

Comparative Example 1

A paint composition was prepared by mixing 35 g of polyester acrylate [Ebecryl 840, Cytec, U.S.A.], 15 g of urethane acrylate [UA-5221, HS Chemtron, Korea], 30 g of tetrahydroperfuryl acrylate (THFA)) [SR285, Sartomer, U.S.A.], 10 g of hexanediol diacrylate (HDDA)) [Miramer M200, Miwon Corporation, Korea], 8 g of a photoinitiator [Darocur 1173, Ciba Chemicals, Switzerland], 0.5 g of an antifoaming agent [TEGO Airex 920, Evonik, Germany], 0.5 g of a labeling agent [TEGO Rad 2250, Evonik, Germany] and 1 g of an adhesion promoter. The composition of the components used is summarized in Table 1.

Comparative Example 2

A paint composition was prepared by mixing 50 g of a modified epoxy acrylate oligomer [CN 150/80, Sartomer, U.S.A.], 30 g of tetrahydroperfuryl acrylate (THFA) [SR285, Sartomer, U.S.A.], 10 g of hexanefiol diacrylate (HDDA) [Miramer M200, Miwon Corporation, Korea], 8 g of a photoinitiator [Darocur 1173, Ciba Chemicals, Switzerland], 0.5 g of an antifoaming agent [TEGO Airex 920, Evonik, Germany], 0.5 g of a labeling agent [TEGO Rad 2250, Evonik, Germany] and 1 g of an adhesion promoter. The composition of the components used is summarized in Table 1.

Comparative Example 3

A paint composition was prepared by mixing 50 g of a bifunctional urethane acrylate [UA-5221, HS Chemtron, Korea], 30 g of tetrahydroperfuryl acrylate (THFA) [SR285, Sartomer, U.S.A.], 11 g of hexanediol diacrylate (HDDA) [Miramer M200, Miwon Corporation, Korea], 6 g of a photoinitiator [Darocur 1173, Ciba Chemicals, Switzerland], 0.5 g of an antifoaming agent [TEGO Airex 920, Evonik, Germany], 0.5 g of a labeling agent [TEGO Rad 2250, Evonik, Germany] and 1 g of an adhesion promoter. The composition of the components used is summarized in Table 1.

TABLE 1

Composition of UV curable resin composition according to Examples and Comparative Examples

| | Example 1 | Example 2 | Example 3 | Comparative Example 1 | Comparative Example 2 | Comparative Example 3 |
|---|---|---|---|---|---|---|
| CN 150/80 | 35 | 34 | | | 50 | |
| 3020-A80 | | | 35 | | | |
| Ebecryl 840 | | | | 35 | | |
| UA-5221 | 15 | | 15 | 15 | | 50 |
| CN 966J75 | | 16 | | | | |
| THFA | 30 | | 30 | 30 | 30 | 30 |
| IBOA | | 30 | | | | |
| HDDA | 10 | | 10 | 10 | 10 | 10 |
| TPGDA | | 10 | | | | |
| D-1173 | 8 | 8 | 8 | 8 | 8 | 8 |
| Airex 920 | 0.5 | 0.5 | 0.5 | 0.5 | 0.5 | 0.5 |
| Rad 2250 | 0.5 | 0.5 | | 0.5 | 0.5 | 0.5 |
| Glide 440 | | | 0.5 | | | |
| Adhesion Promoter | 1 | 1 | 1 | 1 | 1 | 1 |
| Total | 100 | 100 | 100 | 100 | 100 | 100 |

<Tests>

The UV curable resin compositions prepared according to Examples 1 to 3 and Comparative Examples 1 to 3 were respectively coated on the surface of a zinc-plating (G.I) steel sheet, on which a surface treating agent was prepared by adding a pigment to a chrome-free solution, according to the exemplary embodiment in Korean Patent No. 0679659, using a #3 bar coater. After nitrogen was input, UV rays were irradiated to the steel sheet at a radiation dose of 100 to 2000 mJ/cm$^2$ using a UV irradiator, [Fusion 600 vps, Fusion, U.S.A.], thereby forming a coating film to a thickness of 3 to 5 μm. Therefore, the surface of the steel sheet was treated.

Subsequently, the exterior of the formed coating film, corrosion resistance, bendability (processability), impact resistance and adhesion were analyzed by the following methods, and the results are summarized in Table 2.

(1) Exterior

It was observed that the exterior of the coated coating film was well coated without impurities and non-painting parts. The exterior was evaluated according to the following criteria.

□: Nothing was observed.

○: Some defects were observed.

Δ: Cratering was somewhat observed.

x: Cratering was considerably observed and yellowing was observed.

(2) Corrosion Resistance

5% saline was continuously sprayed onto a painted specimen at 35° C. in a humidity of 95%, and early corrosion on the specimen was evaluated. Corrosion resistance was evaluated according to the following criteria.

□: Corrosion did not occur for over 480 hours.

○: Early corrosion was observed after 240 hours.

Δ: Early corrosion was observed after 120 hours.

x: Early corrosion was observed before 72 hours.

(3) Scratch Resistance

Pencil hardness was measured to evaluate scratch resistance, and the pencil hardness was measured according to JIS K5600-5-4KS. Here, the pencil hardness was sequentially measured from 9B to 9H. When the pencil hardness is close to 9B, it indicates that a sample had low hardness, and when the pencil hardness is close to 9H, it indicates that a sample had high hardness.

(4) Adhesion

A coated specimen was cut into 100 pieces to have a size of 1 mm×1 mm (width×length) using a cutter. A 3M tape was put on the specimen and then taken off to evaluate adhesion of a coating film. Adhesion was evaluated according to the following criteria.

☐: Nothing was observed.
○: Less than 10 coating films were detached.
Δ: Less than 50 coating films were detached.
x: All coating films were detached.

TABLE 2

Test Results (Exterior, Corrosion Resistance, Bendability, Scratch Resistance, Adhesion)

|  | Exterior | Corrosion Resistance | Bendability | Impact Resistance | Adhesion | Scratch Resistance |
|---|---|---|---|---|---|---|
| Example 1 | ○ | ○ | 3T | ☐ | ☐ | 4H |
| Example 2 | ○ | ○ | 3T | ☐ | ☐ | 4H |
| Example 3 | ○ | ○ | 3T | ☐ | ☐ | 4H |
| Comparative Example 1 | ○ | ○ | 6T | ☐ | ○ | 2H |
| Comparative Example 2 | Δ | ☐ | 3T | ☐ | ☐ | 4H |
| Comparative Example 3 | ○ | Δ | 6T | ☐ | ○ | 1H |

As shown in Table 2, the physical properties described in Examples 1 to 3 using the UV curable resin composition including the modified epoxy acrylate oligomer showed satisfactory results in exterior, corrosion resistance, bendability, scratch resistance and adhesion categories. Comparative Example 1 using the UV curable resin composition including the polyester acrylate oligomer showed poor processibility. While Comparative Example 2, only including the epoxy acrylate oligomer, showed good processibility, it is difficult to use independently because of the yellowing or high loss of gloss that occurred when the exterior was subjected to an accelerated weathering test such as Weather-O-Meter or QUV.

In addition, Comparative Example 3 using the UV curable resin composition, only including the urethane acrylate oligomer, was expected to have the most excellent bendability. However, in Comparative Example 3, the coating film was flexible, and thus showed poor bendability and scratch resistance.

While the invention has been shown and described with reference to certain exemplary embodiments thereof, it will be understood by those skilled in the art that various changes in form and details may be made therein without departing from the spirit and scope of the invention as defined by the accompanying claims.

When a UV curable resin composition according to the present invention is formed as a coating film on the surface of a metal such as a steel sheet, the steel sheet can have transparency, corrosion resistance, impact resistance, scratch resistance, adhesion, anti-corrosivity, and bendability (processibility). In addition, by using a UV curable resin composition, instead of an oil-type resin composition dried by heat, the process can be environmentally friendly because it uses no solvent and has improved producibility.

The invention claimed is:

1. A UV curable resin composition, comprising:
   25 to 45 parts by weight of a modified epoxy acrylate oligomer;
   10 to 25 parts by weight of a urethane acrylate oligomer;
   21 to 80 parts by weight of a reactive acryl monomer;
   1 to 20 parts by weight of a photoinitiator; and
   0.1 to 10 parts by weight of an additive,
   wherein the reactive acryl monomer is composed of 20 to 50 parts by weight of a monofunctional reactive acryl monomer and 1 to 30 parts by weight of a bifunctional reactive acryl monomer.

2. The composition according to claim 1, wherein the modified epoxy acrylate oligomer is a urethane-modified epoxy acrylate oligomer.

3. The composition according to claim 1, wherein the urethane acrylate oligomer is a reaction product of diisocyanate and (meth)acrylate including a hydroxy group.

4. The composition according to claim 3, wherein the diisocyanate is isophoronediisocyanate or dicyclohexanediisocyanate.

5. The composition according to claim 1, wherein the monofunctional reactive acryl monomer includes at least one selected from the group consisting of acryl morpholine (ACMO), tetrahydroperfuryl acrylate (THFA), hydroxy ethyl acrylate (HEA), hydroxy propyl acrylate (HPA) and isobonyl acrylate (IBOA).

6. The composition according to claim 1, wherein the bifunctional reactive acryl monomer includes at least one selected from the group consisting of diethylene glycol diacrylate (DEGDA), dipropylene glycol diacrylate (DPGDA), tripropylene glycol diacrylate (TPGDA), hexanediol diacrylate (HDDA), polyethylene glycol 400 diacrylate (PEG 400DA) and poylethylene glycol 600 diacrylate (PEG 600DA).

7. A steel sheet which has a coating film formed by coating the UV curable resin composition according to claim 1.

8. The steel sheet according to claim 7, wherein a transparent or color-painted chrome-free coating film is formed on at least one surface of the steel sheet,
   a UV curable resin composition is coated on at least one surface of the transparent or color-painted chrome-free coating film.

9. The steel sheet according to claim 8, wherein the transparent or color-painted chrome-free coating film includes a composition for treating the surface of a metal comprising:
   a) 100 parts by weight of a water-soluble organic resin-inorganic binder complex resin;
   b) 1 to 10 parts by weight of an anti-corrosive and corrosion-resistant agent; and
   c) 1 to 10 parts by weight of a metal chelating agent, on the basis of the total solid content.

10. The steel sheet according to claim 9, wherein the water-soluble organic resin-inorganic binder complex resin is a composition for treating the surface of a metal obtained by reacting an organic resin, an inorganic binder and a coupling agent.

11. The steel sheet according to claim 10, wherein the inorganic binder is a composition for treating the surface of a metal comprising at least one selected from the group consisting of silica sol, alumina sol, titania sol and zirconia sol, and which has a particle size of 5 to 30 nm.

12. The steel sheet according to claim 9, wherein the anti-corrosive and corrosion-resistant agent is selected, when the composition for surface treating of a metal is an acid solution, from the group consisting of an aluminum phosphate aqueous solution, a manganese phosphate aqueous solution, a zinc phosphate aqueous solution, a molybdenum phosphate aqueous solution, and a fluorine phosphate soda aqueous solution, which include phosphoric acid as a stabilizer; and when the composition for surface treating of a metal is a base solution, from the group consisting of a hexaammonium hepta molybdate solution, a diammonium dihydrophosphate solution, an ammonium vanadate solution, a sodium vanadate solution, an ammonium zirconium carbonate solution, and an ammonium fluorozirconate solution, which include an amine as a stabilizer.

13. The steel sheet according to claim 8, wherein the transparent or color-painted chrome-free coating film has a thickness of 0.5 to 2 μm, and the coating film formed on the transparent or color-painted chrome-free coating film by coating the UV curable resin composition has a thickness of 0.5 to 10 μm.

14. A steel sheet which has a coating film formed by coating the UV curable resin composition according to claim 1.

* * * * *

UNITED STATES PATENT AND TRADEMARK OFFICE
CERTIFICATE OF CORRECTION

| | | |
|---|---|---|
| PATENT NO. | : 8,921,501 B2 | Page 1 of 1 |
| APPLICATION NO. | : 13/139333 | |
| DATED | : December 30, 2014 | |
| INVENTOR(S) | : Jin Tae Kim et al. | |

It is certified that error appears in the above-identified patent and that said Letters Patent is hereby corrected as shown below:

Title page, Item (75) 1st Inventor, delete "Gwangyan-si, (KR);" and insert -- Gwangyang-si, (KR): --

In the Claims

Column 14, Line 29, Claim 6, delete "poylethylene" and insert -- polyethylene --

Signed and Sealed this
Twenty-eighth Day of April, 2015

Michelle K. Lee
*Director of the United States Patent and Trademark Office*

UNITED STATES PATENT AND TRADEMARK OFFICE
CERTIFICATE OF CORRECTION

PATENT NO. : 8,921,501 B2
APPLICATION NO. : 13/139333
DATED : December 30, 2014
INVENTOR(S) : Jin Tae Kim et al.

It is certified that error appears in the above-identified patent and that said Letters Patent is hereby corrected as shown below:

Title page, Column 1, Item (73) Assignees, delete "Noroo Holdings Co., Ltd., Anyang-si (KR);"

Signed and Sealed this
Eighth Day of December, 2015

Michelle K. Lee
*Director of the United States Patent and Trademark Office*